United States Patent
Gauthier et al.

(10) Patent No.: US 10,224,423 B1
(45) Date of Patent: Mar. 5, 2019

(54) HETEROJUNCTION BIPOLAR TRANSISTOR AND METHOD OF MANUFACTURING THE SAME

(71) Applicant: STMicroelectronics (Crolles 2) SAS, Crolles (FR)

(72) Inventors: Alexis Gauthier, Meylan (FR); Pascal Chevalier, Chapareillan (FR); Gregory Avenier, Saint Nazaire les Eymes (FR)

(73) Assignee: STMircoelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/783,469

(22) Filed: Oct. 13, 2017

(51) Int. Cl.
| | |
|---|---|
| H01L 21/8238 | (2006.01) |
| H01L 21/331 | (2006.01) |
| H01L 21/8222 | (2006.01) |
| H01L 29/732 | (2006.01) |
| H01L 29/06 | (2006.01) |
| H01L 29/08 | (2006.01) |
| H01L 29/66 | (2006.01) |
| H01L 29/10 | (2006.01) |
| H01L 21/3105 | (2006.01) |

(52) U.S. Cl.
CPC .... *H01L 29/7322* (2013.01); *H01L 21/31056* (2013.01); *H01L 29/0649* (2013.01); *H01L 29/0804* (2013.01); *H01L 29/0821* (2013.01); *H01L 29/1004* (2013.01); *H01L 29/66242* (2013.01); *H01L 29/66272* (2013.01)

(58) Field of Classification Search
CPC .......... H01L 21/31056; H01L 29/7322; H01L 29/0649
USPC ....................................... 438/204, 318, 337
See application file for complete search history.

(56) References Cited

U.S. PATENT DOCUMENTS

| | | | |
|---|---|---|---|
| 6,940,149 | B1 | 9/2005 | Divakaruni et al. |
| 9,368,608 | B1 * | 6/2016 | Camillo-Castillo ........................ H01L 29/7371 |
| 2001/0017399 | A1 | 8/2001 | Oda et al. |
| 2002/0053705 | A1 | 5/2002 | Kondo et al. |
| 2007/0275533 | A1 | 11/2007 | Vaed et al. |
| 2010/0187657 | A1 | 7/2010 | Boeck et al. |
| 2013/0270649 | A1 | 10/2013 | Chantre et al. |
| 2014/0217551 | A1 | 8/2014 | Dunn et al. |

(Continued)

FOREIGN PATENT DOCUMENTS

EP   1087424 A1   3/2001

OTHER PUBLICATIONS

Diop, et al., "Impact of inside spacer process on fully self-aligned 250 GHz SiGe:C HBTs reliability performances: a-Si vs. nitride," Microelectronics Reliability, vol. 48, Issues 8-9, Aug.-Sep. 2008, pp. 1198-1201.

*Primary Examiner* — David S Blum
(74) *Attorney, Agent, or Firm* — Crowe & Dunlevy (57) ABSTRACT

A bipolar transistor is supported by a single-crystal silicon substrate including a collector contact region. A first epitaxial region forms a collector region of a first conductivity type on the collector contact region. A second epitaxial region forms a base region of a second conductivity type. Deposited semiconductor material forms an emitter region of the first conductivity type. The collector region, base region and emitter region are located within an opening formed in a stack of insulating layers that includes a sacrificial layer. The sacrificial layer is selectively removed to expose a side wall of the base region. Epitaxial growth from the exposed sidewall forms a base contact region.

20 Claims, 7 Drawing Sheets

(56) References Cited

U.S. PATENT DOCUMENTS

2015/0140771 A1    5/2015  Fox et al.
2016/0211345 A1*  7/2016  Ding ........................ H01L 29/73
2016/0380088 A1  12/2016  Camillo-Castillo et al.
2017/0236923 A1    8/2017  Chevalier
2018/0240897 A1*  8/2018  Liu ................... H01L 29/66242

* cited by examiner

HETEROJUNCTION BIPOLAR TRANSISTOR AND METHOD OF MANUFACTURING THE SAME

TECHNICAL FIELD

The present disclosure relates to a heterojunction bipolar transistor and to a method of manufacturing a heterojunction bipolar transistor.

BACKGROUND

For high-frequency applications, bipolar transistors, and in particular heterojunction bipolar transistors (HBT), are currently used. It is known to integrate bipolar transistors in standard CMOS methods.

The fabrication of a bipolar transistor from a stack of semiconductor regions forming the emitter, the base, and the collector of the transistor poses various problems. In particular, a problem is to form a base contact region while keeping a low resistance of access to the base region and a low stray capacitance between the base and the collector.

United States Patent Application Publication No. 2017/0236923, incorporated by reference, teaches a heterojunction bipolar transistor and method of manufacturing. Concerns with this heterojunction bipolar transistor and method of manufacturing include: the process flow is too complicated; the resulting device suffers from concerns with robustness; the nitride remaining at the end of the process flow contributes to reliability issues; the process is difficult to implement at small processing nodes (such as 28 nm) due to the height of the structure leading to difficulties with premetallization dielectric construction and contact patterning modification; and the emitter resistance is not optimal due to the emitter "plug" effect (a key parameter for high speed operation).

It would thus be desirable to have a heterojunction bipolar transistor and a method of manufacturing a heterojunction bipolar transistor that solves at least some of the foregoing problems.

SUMMARY

In an embodiment, a method is provide for manufacturing a bipolar transistor in a structure including a single-crystal silicon substrate coated in succession with a first insulating layer, a silicon layer and a stack of layers comprising a sacrificial layer made of a first material arranged between two insulating layers made of a second material selectively etchable over the first material. The method comprises the steps of: a) etching an opening through the stack of layers, the silicon layer and the first insulating layer to expose a top surface of the substrate; b) laterally recessing the silicon layer within the opening to form an open region that annularly surrounds the opening; c) in the opening, forming by selective epitaxy from the top surface of the substrate, to a level higher than a lower level of the stack, a collector region made of semiconductor material doped with a first conductivity type, wherein the collector region closes off the annular open region to form an annular air spacer between the collector region and the silicon layer; d) in the opening, further forming by selective epitaxy from a top surface of the collector region, to a level at least as high as an upper level of the sacrificial layer, a base region made of semiconductor material doped with a second conductivity type; e) in the opening, further forming by deposition on a top surface of the base region, an emitter region made of semiconductor material doped with the first conductivity type; f) etching said stack to reach the sacrificial layer; g) removing the sacrificial layer to expose a side wall of the base region; and h) forming a first portion of a base contact region by epitaxy from the side wall of the base region exposed by the removal of the sacrificial layer.

In an embodiment, a bipolar transistor comprises: a single-crystal semiconductor substrate; a first insulating layer over the single-crystal semiconductor substrate; a silicon layer over the first insulating layer; a stack of layers over the silicon layer; an opening extending through the stack of layers, the silicon layer and the first insulating layer; a recess of the silicon layer providing an open region that annularly surrounds the opening; a semiconductor collector region doped with a first conductivity type within the opening and resting on the single-crystal semiconductor substrate, said semiconductor collector region closing off the annular open region to form an annular open spacer between the semiconductor collector region and the silicon layer; a semiconductor base region doped with a second conductivity type on top of the semiconductor collector region; a semiconductor emitter region doped with the first conductivity type on the semiconductor base region and laterally extending beyond the base semiconductor region; and a single crystal base contact region extending from a side wall of the semiconductor base region and lying between two insulating layers of said stack.

In an embodiment, a method comprises: forming a collector contact region doped with a first conductivity type in a semiconductor substrate; providing a first insulating layer over the collector contact region; providing a first silicon layer over the first insulating layer; depositing a stack of layers over the first silicon layer, said stack of layers comprising a second insulating layer, a sacrificial layer and a third insulating layer; etching an opening extending through the stack of layers, the first silicon layer and the first insulating layer to expose a portion of the semiconductor substrate at said collector contact region; laterally recessing the first silicon layer within the opening to form an open region that annularly surrounds the opening; epitaxially growing in said opening from the exposed portion of the semiconductor substrate a collector region doped with the first conductivity type that closes said open region to form an annular open spacer; epitaxially growing in said opening from the collector region a base region doped with a second conductivity type; depositing a second silicon layer doped with the first conductivity type in said opening on the base semiconductor layer to form an emitter region; selectively removing the sacrificial layer to expose a side wall of said base region; and epitaxially growing from the exposed side wall a first portion of a base contact region.

BRIEF DESCRIPTION OF THE DRAWINGS

The foregoing and other features and advantages will be discussed in detail in the following non-limiting description of specific embodiments in connection with FIGS. 1 to 14, these drawings being cross-section views illustrating steps of an embodiment of a method for manufacturing a heterojunction bipolar transistor.

DETAILED DESCRIPTION

The same elements have been designated with the same reference numerals in the various drawings and, further, the various drawings are not to scale. For clarity, only those elements which are useful to the understanding of the described embodiments have been shown and are detailed. In particular, certain masks used during the steps of the manufacturing method described hereafter have not been shown.

In the following description, terms "high", "side", "lateral", "top", "above", "under", "on", "upper", and "lower" refer to the orientation of the concerned elements in the corresponding drawings.

Figure 1:
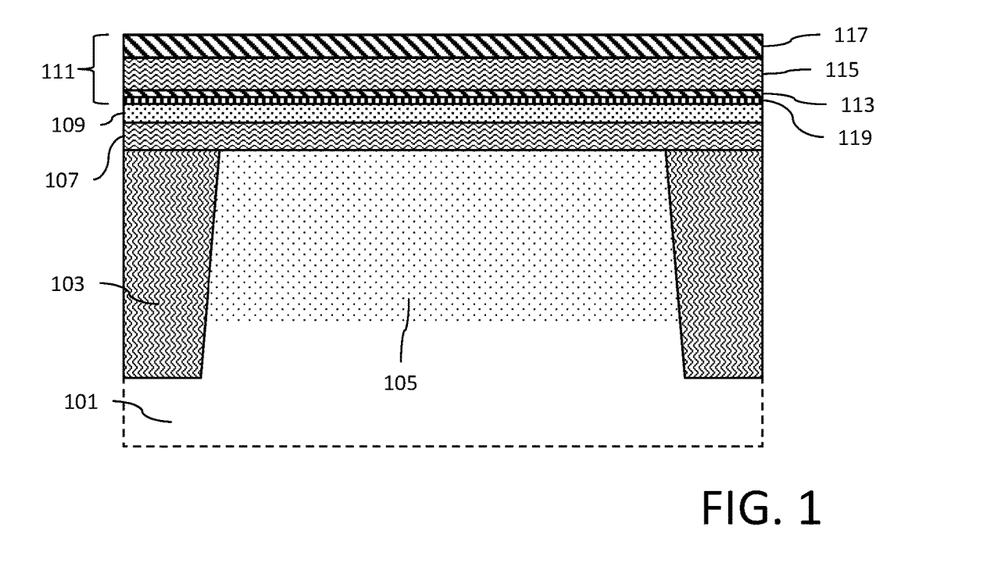

In FIG. 1, a structure comprises a single-crystal silicon substrate 101 including insulating structures 103, for example, of the deep trench isolation (DTI) type, are provided to delimit a location where a heterojunction bipolar transistor is desired to be formed. At the location of the transistor, substrate 101 comprises a heavily-doped region 105 of a first conductivity type, for example, type N. The region 105 is flush with the upper (top) surface of substrate 101 and forms a collector contact region for the heterojunction bipolar transistor.

The upper surface of substrate 101 is coated with an insulating layer 107 (that is made of silicon dioxide, for example) that is coated with a semiconductor material (for example, silicon) layer 109. Layer 109 may be a polysilicon layer deposited on insulating layer 107. Layer 109 may also be a single-crystal silicon layer. As an example, the layer 109 may correspond to the silicon layer of a structure of SOI (Semiconductor On Insulator) type. Layer 109 may have a doping of a second conductivity type, for example, type P.

The deep trench isolation insulating structures 103 may be formed before the deposition of each of the layers forming the stack of layers 111, particularly in the case where silicon layer 109 is the silicon layer of an SOI-type structure.

A stack of layers 111 rests on layer 109. The stack 111 comprises a first insulating layer 119 that is coated with a second insulating layer 113 (also referred to herein as a first sacrificial layer) that is coated with a third insulating layer 115 that is coated with a fourth insulating layer 117 (also referred to herein as a second sacrificial layer). The material of layers 115 and 119 and the material of layers 113 and 117 are selected to be selectively etchable over each other. In an embodiment, the layers 113 and 117 are made of silicon nitride and the layers 115 and 119 are made of silicon oxide. The stack 111 may, for example, have a thickness of 80 nm (which is thinner than a comparable stack of United States Patent Application Publication No. 2017/0236923).

Figure 2:
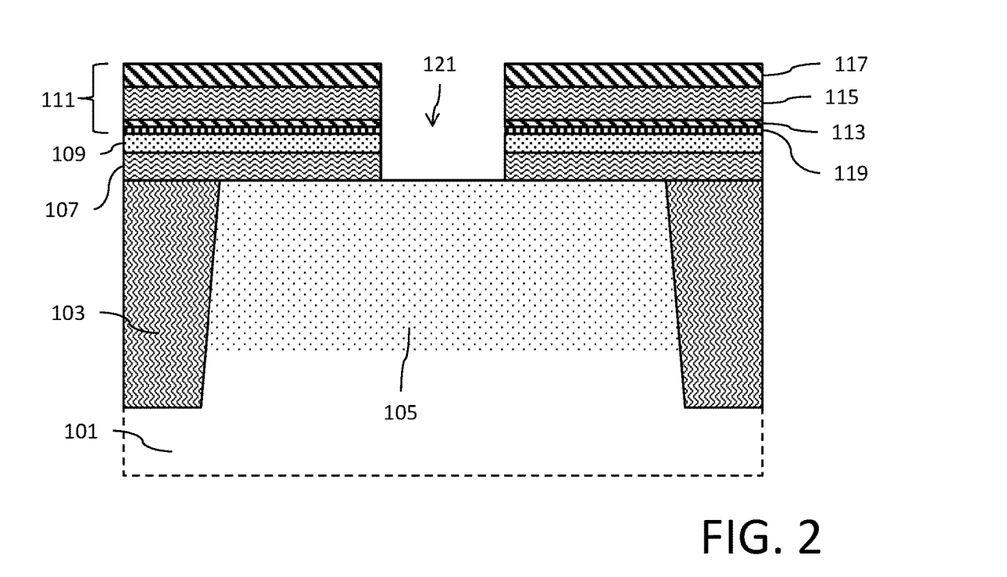

FIG. 2 shows the structure after the etching of an opening 121 that crosses completely through the stack 111, the silicon layer 109, and the insulating layer 107 all the way to reach the collector contact region 105 at the top surface of the substrate 101. The etch process used may, for example, comprise major anisotropic and minor isotropic etch steps.

Figure 3:
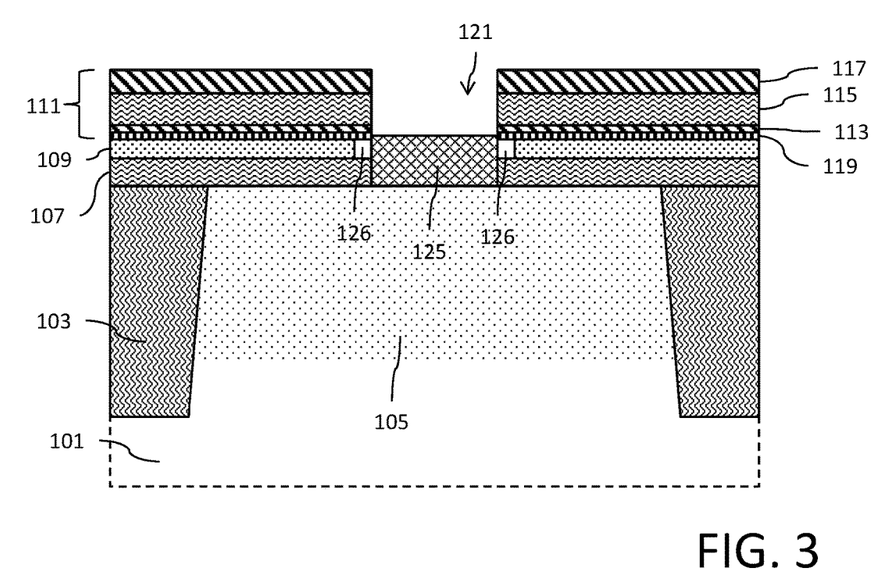

FIG. 3 shows the structure after forming, in opening 21, a transistor collector region 125 of the heterojunction bipolar transistor. The collector region 125 is made of a region of single-crystal silicon formed by selective epitaxy from the top surface of substrate 101. The collector region 125 has a thickness such that a top surface of the collector region 125 is at least as high as a top surface of the layer 109 and lower than or equal to a bottom surface of layer 115. Preferably, the level of the top surface of collector region 125 is slightly lower, for example, by from 1 to 3 nm, than the lower surface of layer 115. The collector region 125 is doped during the epitaxy or by implantation after the epitaxy with the first conductivity type. As an example, the collector region 125 is doped with phosphorus atoms, possibly associated with carbon atoms to limit the exodiffusion of phosphorus atoms, and/or with arsenic atoms.

Because the lateral walls of opening 121 are not covered by an insulating layer, there is a lateral etching of the silicon layer 109 caused by the cycled epitaxial process, and this lateral etch forms open regions 126 at the side edge of the collector 125. The open regions 126 are laterally closed off by the epitaxial growth of the collector region 125 to form air spacers between the sidewalls of the collector 125 and the semiconductor layer 109. The open regions 126 completely surround the collector region 125, and in this configuration will annularly surround the opening 121. The annular region 126 is thus closed off by the epitaxially grown collector region 125. The annular region 126 may, for example, have cross-sectional dimensions of a height in the range of 10-30 nm and a width in the range of 10-50 nm.

Details of the cyclical epitaxy process used in the formation of the collector region 125 are provided in U.S. patent application Ser. No. 15/783,109, filed Oct. 13, 2017 entitled "Cyclic Epitaxy Process to Form Air Gap for Isolation for a Bipolar Transistor."

Figure 4:
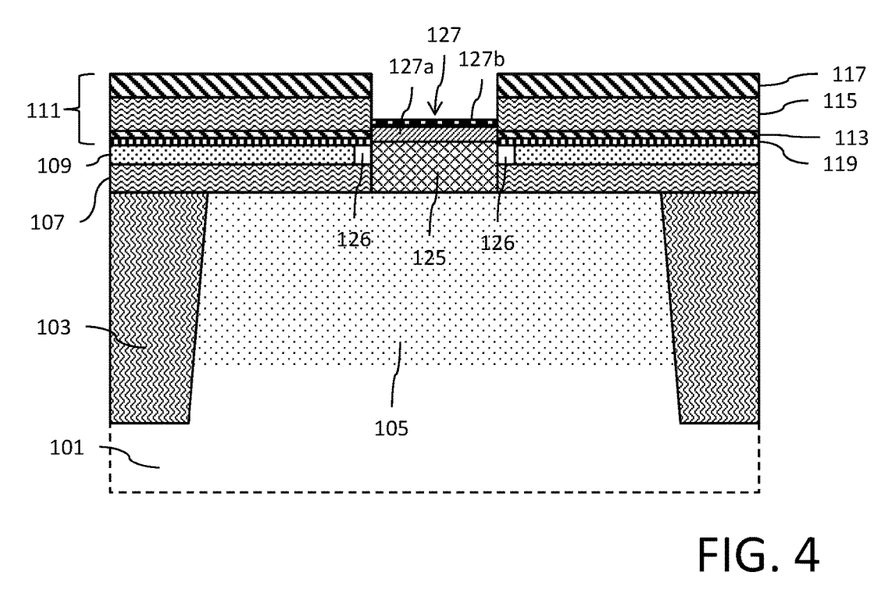

FIG. 4 shows the structure after the forming, in opening 121, a transistor base region 127 comprising a stack of a doped region 127a and a silicon capping region 127b. The doped region 127a of the transistor base region 127 is made of a single-crystal semiconductor material such as silicon or, preferably, silicon-germanium as in the present embodiment. Doped region 127a is formed by selective epitaxy from collector region 125. The doped region 127a has a thickness such that a top surface of the doped region 127a is higher than a top surface of the insulating layer 113 but below the top surface of the layer 115. The doped region 127a is doped with the second conductivity type, preferably during the epitaxy. As an example, doped region 127a is doped with boron atoms, possibly associated with carbon atoms to avoid the exodiffusion of the boron atoms. The silicon capping region 127b is made of undoped single crystal semiconductor material and is formed by selective epitaxy from the top surface of the doped region 127a. The silicon capping region 127b has a thickness such that a top surface of the silicon capping region 127b is below the top surface of the layer 115.

Figure 5:
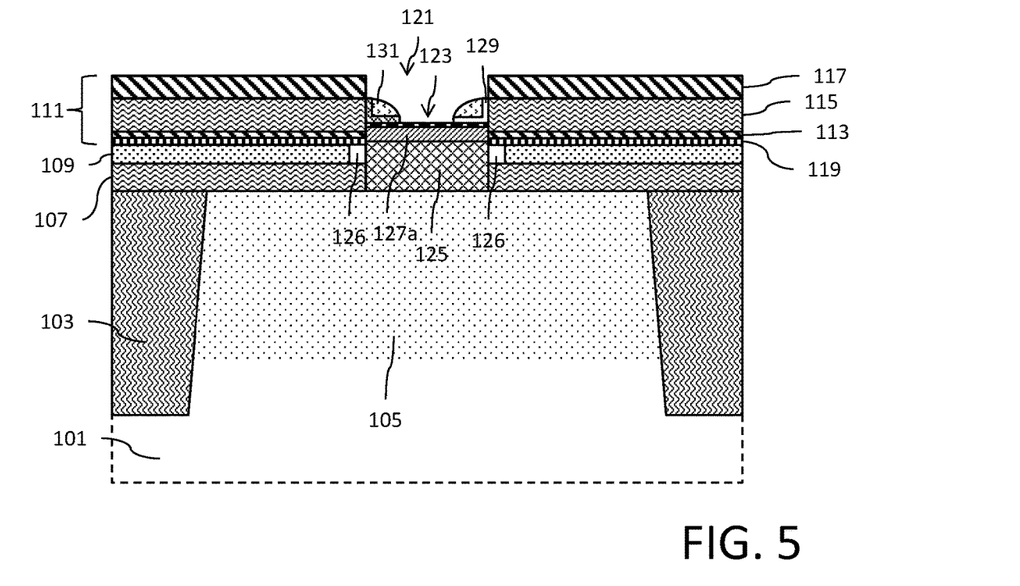

In FIG. 5, spacers 129 have been formed in the opening 121. The spacers 129 rest on the top surface of silicon capping region 127b and border the sidewall surfaces of at least the layer 115. An opening 123 is provided between the spacers 129 to expose a top surface of the silicon capping region 127b. The spacers 129 have, for example, in cross-sectional view, an L shape. As an example, the spacers 129 are made of silicon oxide. The spacers are formed by forming a silicon oxide layer on the sidewalls of the layer 115 and top surface of the silicon capping region 127b in the opening 121. A nitride deposit is then made on the silicon oxide layer followed by an etch which preferentially removes nitride material from horizontal surfaces. The nitride material remaining after the etch forms a "D" shape spacer 131 which functions as a mask. This mask is used for perform a further etch to remove a portion of the silicon oxide layer to make the opening 123.

Figure 6:
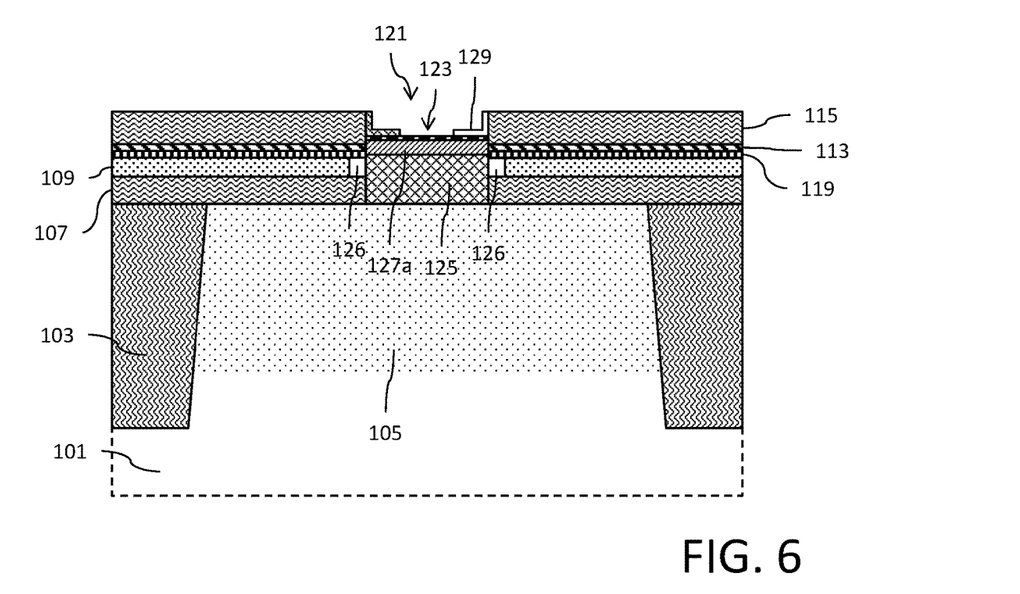

The remaining nitride material of the spacer 131 for the etch mask as well as the silicon nitride layer (second sacrificial layer) 117 are then removed by using an isotropic etching process. The result is shown in FIG. 6.

Figure 7:
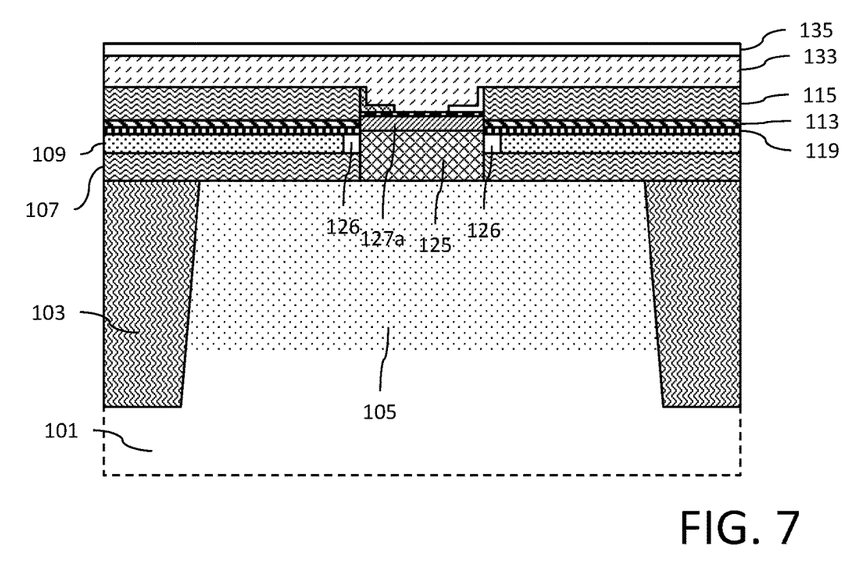

A silicon layer 133 doped with the first conductivity type is deposited all over the structure and fills openings 121 and 123. As an example, the silicon layer is deposited by RTCVD ("Reduced Temperature Chemical Vapor Deposition"), which enables the deposited silicon to be monocrystalline at the interface with the silicon capping region 127b of the transistor base region 127. A chemical mechanical polish may then be performed to planarize the top surface of the layer 133. An etch mask formed by a layer 135 (made of silicon oxide, for example) is then formed on the planar top surface of layer 133. The result is shown in FIG. 7.

Figure 8:
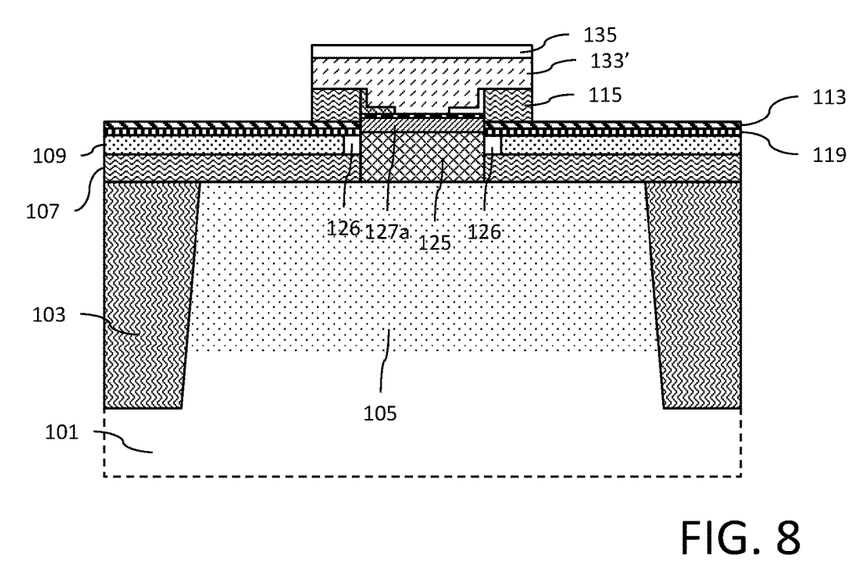

Convention lithographic processing is then performed to pattern the etch mask layer 135. An anisotropic etch is then performed to remove the unmasked portion of the doped silicon layer 133 and the unmasked portion of the oxide layer 115 all the way to nitride layer 113. The result is shown in FIG. 8. Thus, a portion 133' of the silicon layer 133 is left in place and forms the emitter region of the heterojunction bipolar transistor. The emitter region 133' comprises a central portion resting on the transistor base region 127 at silicon capping region 127b (extending through the opening 123) and a peripheral portion that laterally extends beyond the base region 127 and rests on a remaining portion of the layer 115.

Figure 9:
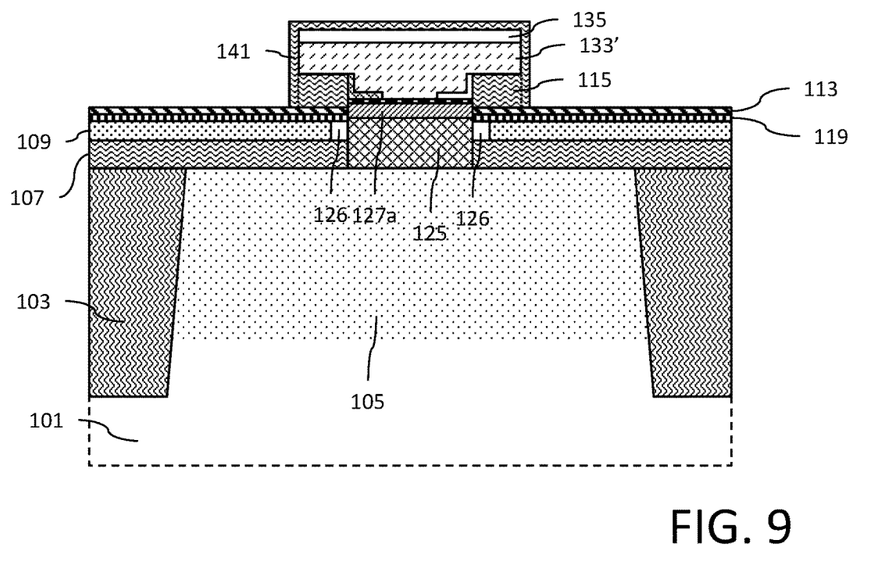

A deposition of a silicon oxide layer 141 is made to cover the top of layer 135 and the side walls of the emitter region 133' and the side walls of the remaining portion of the oxide layer 115. Then, an anisotropic etch is performed to remove the silicon oxide from the top surface of the first sacrificial layer 113. The result is shown in FIG. 9. In an embodiment, the layer 135 may be removed prior to the deposition of layer 141.

Figure 10:
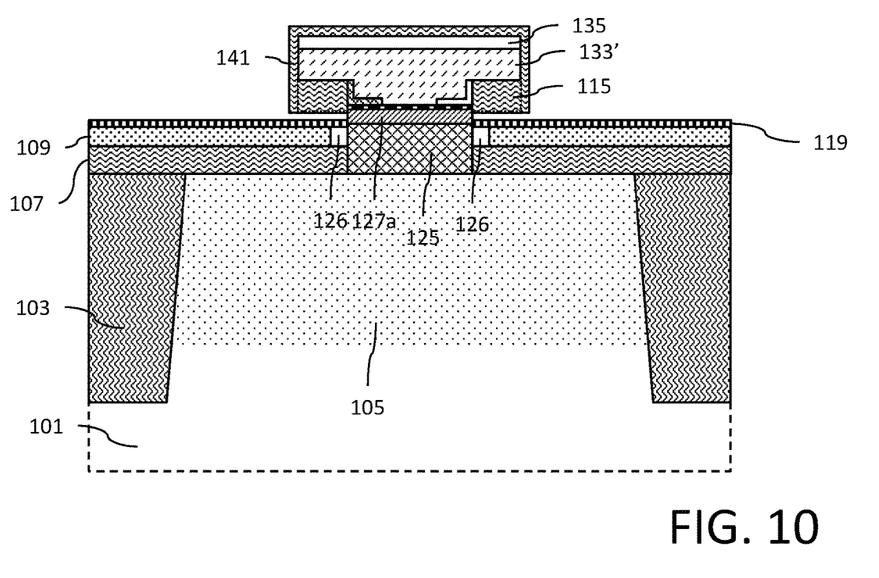

In the step illustrated by FIG. 10, the first sacrificial nitride layer 113 has been removed by isotropic etching selective over the material of layers 115, 119 and 141. This exposes the lateral side wall of the base region 127 (more specifically, a lateral side wall of the doped region 127a).

Figure 11:
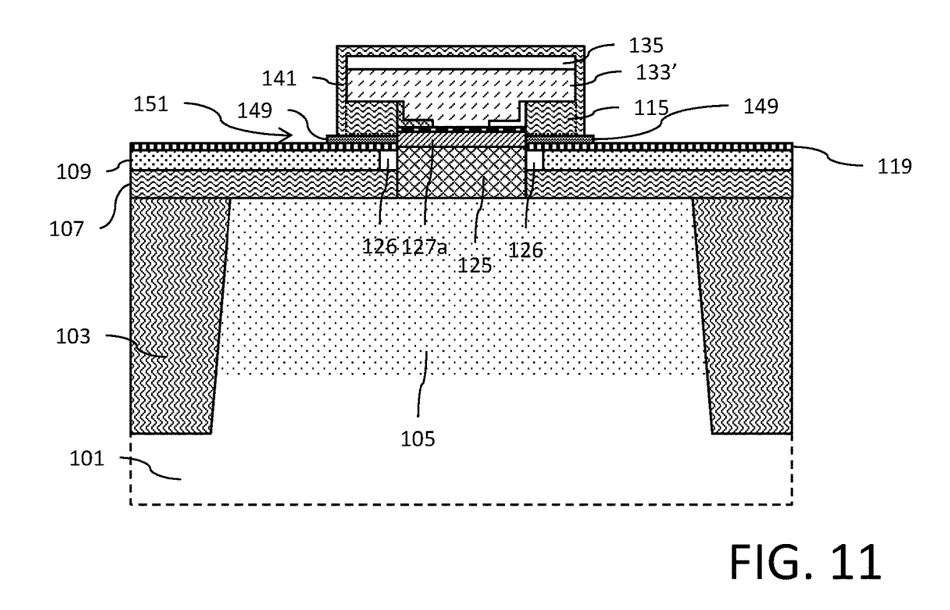

FIG. 11 shows the structure after formation of a first portion 149 of a base contact region 151. The first portion 149 is made of single-crystal silicon formed by selective epitaxy from the lateral side wall of the base region 127. Thus, the portion 149 of the base contact region 151 is monocrystalline, which advantageously enables to decrease the resistance at the interface between base contact region 151 and base region 127 with respect to the case of a transistor which would have its base contact region made of polysilicon. In this example, the first portion 149 of base contact region 151 extends laterally all the way at least to the peripheral edge of the remaining portion of layer 141.

Figure 12:
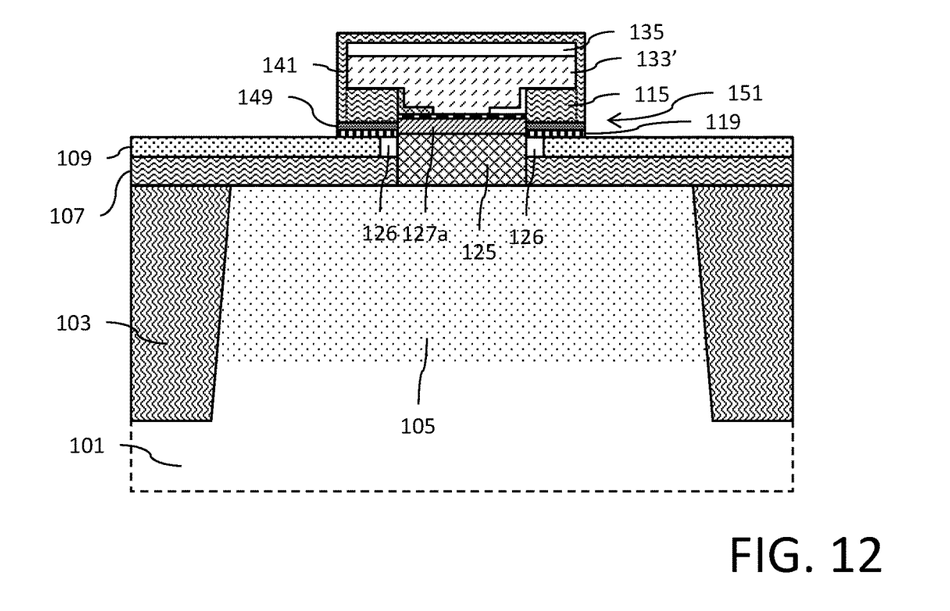

Conventional isotropic etching techniques are then used to selectively remove a portion of insulating layer 119 and expose a top surface of the semiconductor layer 109. The result is shown in FIG. 12.

Figure 13:
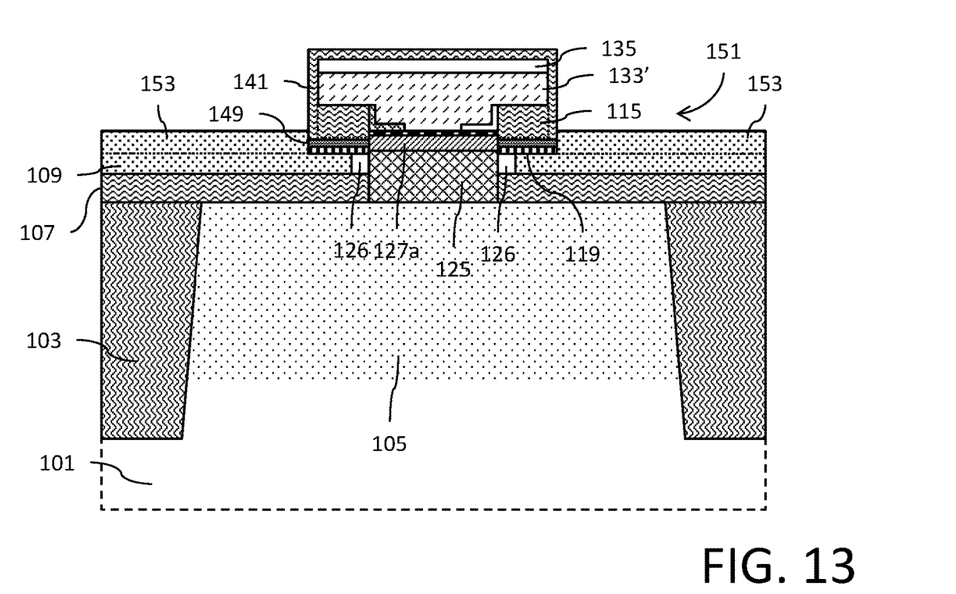

FIG. 13 shows the structure after formation of a second portion 153 of the base contact region 151. The second portion 153 is made of polycrystalline silicon formed by selective epitaxy of doped silicon of the second conductivity type from the top surface of the polysilicon semiconductor layer 109 and the lateral side wall of the first portion 149. In the case where silicon layer 109 was not doped at the step of FIG. 1, it may be doped by diffusion of dopant atoms from the base contact region 151, and in particular from the first portion 149.

Figure 14:
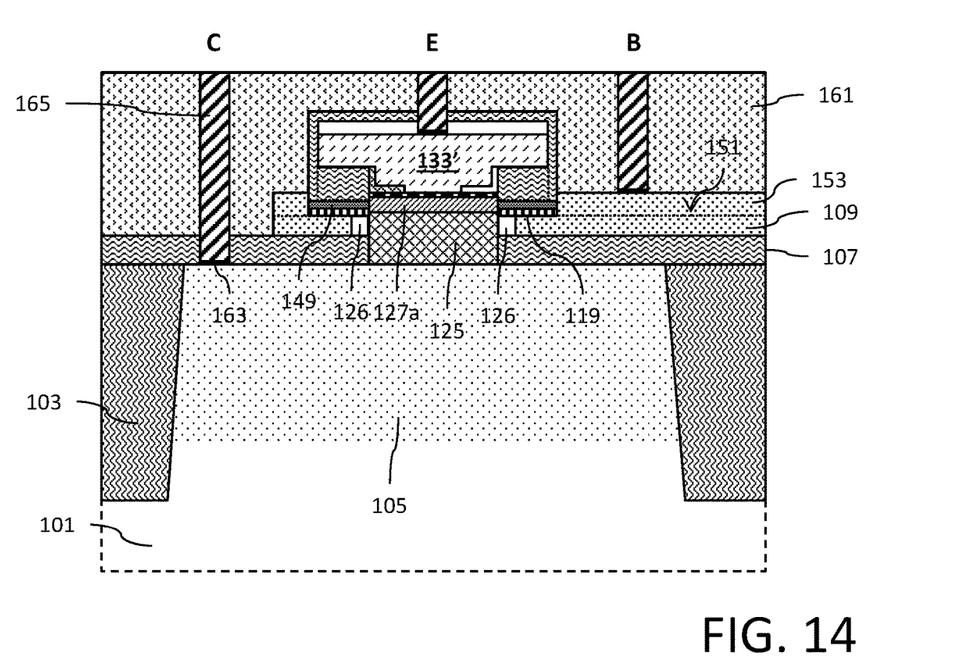

An example of the configuration for making electrical contact to the emitter (E), base (B) and collector (C) terminals of the heterojunction bipolar transistor is shown in FIG. 14. A premetallization dielectric layer 161 covers the structure. A layer of silicide 163 is provided at each contact location with the collector contact region 105, the emitter region 133' and the base contact region 151. A metal contact plug 165 extends through the premetallization dielectric layer 161 to make contact with the silicide 163.

Advantageously, if the starting point for the substrate is a SOI-type structure, then the semiconductor layer 109 is made of single-crystal silicon and the second portion 153 of base contact region 151 will also be made of single-crystal silicon grown by selective epitaxy. Advantageously, the entire base contact region 151 in such an implementation will be made of single-crystal silicon which enables to decrease the resistance of base contact region 151, and thus decrease the resistance of access to the base region 127 with respect to the case of a transistor where all or part of the base contact region is made of polysilicon.

Access to the collector contact region 105 for the purpose of exposing the top surface of the substrate 101 can be achieved by forming a mask over the emitter region 133' and on portions of the base contact region 151 that laterally extend adjacent to the emitter region 133'. An etch may then be performed through the mask. The premetallization dielectric layer 161 may then be deposited over the structures.

The silicide process to form silicide layers 163 may be performed using well known techniques at any suitable point in the fabrication process. The silicide layers 163 are formed at the upper surface of the emitter region 133', on the upper surface of collector contact region 105, and on the upper surface of the base contact region 151.

In an alternative implementation, the first and second portions 149 and 153 of the base contact region 151 may be formed simultaneously. To achieve this, the nitride layer 113 is removed to expose the lateral side wall of the base region 127 and the portion of insulating layer 119 is removed to expose the top surface of the semiconductor layer 109. These removal steps are performed prior to performing any epitaxial growth. Then, the first and second portions 149 and 153 are simultaneously formed by epitaxy from the side wall of base region 127 and the top surface of silicon layer 109. A structure similar to that shown in FIG. 12 is then obtained.

In the transistor of FIG. 14, the base contact region 151 is insulated from the collector region 125 by the air spacer 126 and the remaining portion of the layer 119. The base contact region 151 makes contact with the base region 127 at the level of at least part of the side wall of the base region 127. This structure minimizes the risk of diffusion of dopant atoms from the base contact region 151 to the collector region 125. As a result, there is a reduction in base-collector capacitance. Still further, this permits an increase in the doping level of the base contact region 151 so as to achieve a decrease in access resistance to the base region 127 without concern that this increased doping will lead to an increase in the base-collector capacitance.

Advantageously, in the transistor of FIG. 14, the shortest conductive path between the base region 127 and silicide 163 for the base contact region 151 is made of single-crystal semiconductor material. As a result, the resistance of access to the base region 127 is reduced.

Further, in the transistor of FIG. 14, the separation between the upper level of base contact region 151 and the lower level of emitter region 133' can be controlled by the process step of epitaxial growth of the second portion 153 so as to decrease the stray capacitance between base contact region 151 and the emitter region 133'.

Advantageously, the previously-described method enables to form in self-aligned fashion the collector region 125, base region 127, and emitter region 133' of a bipolar transistor without providing many masking and/or etch steps.

Each step of the previously-described method is a step currently used in standard CMOS methods, whereby this method is compatible with standard CMOS methods.

As an example, the various previously-described layers, regions, portions may have the following dimensions:

a thickness in the range from 10 to 75 nm, for example, 25 nm, for insulating layer 107;

a thickness in the range from 3 to 20 nm, for example, 7 nm, for silicon layer 109;

a thickness in the range from 10 to 40 nm, for example, 20 nm, for insulating layer 113;

a thickness in the range from 5 to 20 nm, for example, 10 nm, for insulating layer 119;

a thickness in the range from 10 to 50 nm, for example, 25 nm, for layers 115 and 117;

a width from 0.1 to 0.3 µm, for example, 0.2 µm, for opening 121; and a thickness in the range from 50 to 200 nm, for example, 75 nm, for the silicon layer 133.

The doping levels of the various previously-described layers, regions, portions will be selected conventionally.

Specific embodiments have been described. Various alterations, modifications, and improvements will occur to those skilled in the art. In particular, the number and the order of the steps of the previously-described method may be adapted by those skilled in the art. For example, the steps of cleaning the exposed surfaces of the semiconductor regions from which the epitaxies are performed may be provided before each epitaxy step. Additional spacer structures may be provided as needed. During the step of forming the collector region 125, only a central and/or lower portion of region 125 may be doped by selective implantation of dopant atoms.

It will readily occur to those skilled in the art that the previously-indicated conductivity types for the layers, regions, etc. may all be inverted.

Although an embodiment of a method where the base region 127 is made of silicon-germanium has been described, the base region 127 may also be formed by epitaxy of silicon, germanium, or another semiconductor material capable of growing by epitaxy from silicon and from which silicon can grow by epitaxy. For example, this method may be used to manufacture transistors using III-V semiconductors.

Alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of manufacturing a bipolar transistor in a structure including a single-crystal silicon substrate coated in succession with a first insulating layer, a silicon layer and a stack of layers comprising a sacrificial layer made of a first material arranged between two insulating layers made of a second material that is selectively etchable over the first material, the method comprising the steps of:

a) etching an opening through the stack of layers, the silicon layer and the first insulating layer to expose a top surface of the single-crystal silicon substrate;

b) laterally recessing the silicon layer within the opening to form an open region that annularly surrounds the opening;

c) in the opening, forming by selective epitaxy from the top surface of the single-crystal silicon substrate, to a level higher than a lower level of the stack, a collector region made of semiconductor material doped with a first conductivity type, wherein the collector region closes off the annular open region to form an annular air spacer between the collector region and the silicon layer;

d) in the opening, further forming by selective epitaxy from a top surface of the collector region, to a level at least as high as an upper level of the sacrificial layer, a base region made of semiconductor material doped with a second conductivity type;

e) in the opening, further forming by deposition on a top surface of the base region, an emitter region made of semiconductor material doped with the first conductivity type;

f) etching said stack to reach the sacrificial layer;

g) removing the sacrificial layer to expose a side wall of the base region; and h) forming a first portion of a base contact region by epitaxy from the side wall of the base region exposed by the removal of the sacrificial layer.

2. The method of claim 1, further comprising i) etching through said stack to reach a top surface of the silicon layer, and wherein step h) further comprises forming a second portion of the base contact region by epitaxy from the top surface of the silicon layer.

3. The method of claim 2, wherein steps f) and i) for etching will leave in place a portion of the two insulating layers adjacent the collector region, the base region and the emitter region.

4. The method of claim 2, further comprising:

siliciding a top surface portion of each of the single-crystal silicon substrate, the base contact region and the emitter region;

depositing a premetallization dielectric layer; and forming metal contacts extending through the premetallization dielectric layer to reach each silicided top surface portion.

5. The method of claim 1 wherein the single-crystal silicon substrate, first insulating layer and silicon layer form a silicon on insulator (SOI) type substrate.

6. The method of claim 1, wherein the silicon layer is a single-crystal silicon layer.

7. The method of claim 6, wherein the silicon layer is doped with the second conductivity type.

8. The method of claim 1, further comprising doping a collector contact region located within the single-crystal silicon substrate under the collector region with the first conductivity type.

9. The method of claim 1, wherein the first material is silicon nitride and the second material is silicon oxide.

10. The method of claim 1, wherein the semiconductor material of the collector region is silicon.

11. The method of claim 1, wherein the semiconductor material of the base region is silicon-germanium.

12. The method of claim 1, wherein the semiconductor material of the emitter region is silicon.

13. The method of claim 1, wherein the base region made of semiconductor material includes a first portion doped with the second conductivity type and a second portion that is undoped.

14. The method of claim 1, wherein the annular air spacer has cross sectional dimensions of a height in a range of 10-30 nm and a width in a range of 10-50 nm.

15. A method, comprising:

forming a collector contact region doped with a first conductivity type in a semiconductor substrate;

providing a first insulating layer over the collector contact region;

providing a first silicon layer over the first insulating layer;

depositing a stack of layers over the first silicon layer, said stack of layers comprising a second insulating layer, a sacrificial layer and a third insulating layer;

etching an opening extending through the stack of layers, the first silicon layer and the first insulating layer to expose a portion of the semiconductor substrate at said collector contact region;

laterally recessing the first silicon layer within the opening to form an open region that annularly surrounds the opening;

epitaxially growing in said opening from the exposed portion of the semiconductor substrate a collector region doped with the first conductivity type that closes said open region to form an annular open spacer;

epitaxially growing in said opening from the collector region a base region doped with a second conductivity type;

depositing a second silicon layer doped with the first conductivity type in said opening on the base semiconductor layer to form an emitter region;

selectively removing the sacrificial layer to expose a side wall of said base region; and epitaxially growing from the exposed side wall a first portion of a base contact region.

16. The method of claim 15, further comprising:

removing the second insulating layer to expose an upper surface of the first silicon layer; and epitaxially growing from the exposed upper surface of the first silicon layer a second portion of the base contact region.

17. The method of claim 16, further comprising:

siliciding an upper surface of the second portion of the base contact region; and siliciding an upper surface of the emitter region.

18. The method of claim 17, further comprising siliciding an upper surface of the semiconductor collector region.

19. The method of claim 15, wherein the base region includes a first portion doped with the second conductivity type and a second portion that is undoped.

20. The method of claim 15, wherein the annular open spacer has cross sectional dimensions of a height in a range of 10-30 nm and a width in a range of 10-50 nm.

* * * * *

UNITED STATES PATENT AND TRADEMARK OFFICE
CERTIFICATE OF CORRECTION

PATENT NO. : 10,224,423 B1  
APPLICATION NO. : 15/783469  
DATED : March 5, 2019  
INVENTOR(S) : Alexis Gauthier et al.

Page 1 of 1

It is certified that error appears in the above-identified patent and that said Letters Patent is hereby corrected as shown below:

On the Title Page

(73) Assignee: should read as: STMicroelectronics (Crolles 2) SAS, Crolles (FR)

Signed and Sealed this
First Day of October, 2019

Andrei Iancu
*Director of the United States Patent and Trademark Office*